United States Patent
Abele

(10) Patent No.: US 7,199,689 B1
(45) Date of Patent: Apr. 3, 2007

(54) HIGH FIELD NMR PERMANENT MAGNETIC STRUCTURE

(75) Inventor: Manlio Abele, New York, NY (US)

(73) Assignee: BRK Wireless Company, Inc, Park Ridge, IL (US)

( * ) Notice: Subject to any disclaimer, the term of this patent is extended or adjusted under 35 U.S.C. 154(b) by 0 days.

(21) Appl. No.: 11/327,730

(22) Filed: Jan. 9, 2006

(51) Int. Cl.
  *H01F 1/00* (2006.01)
  *H01F 3/00* (2006.01)
  *H01F 7/00* (2006.01)

(52) U.S. Cl. .................. 335/296; 335/306; 324/319
(58) Field of Classification Search ........ 335/302–306; 324/318–322; 505/844
  See application file for complete search history.

(56) References Cited

U.S. PATENT DOCUMENTS

| | | | | |
|---|---|---|---|---|
| 4,727,327 A | * | 2/1988 | Toyoshima et al. | 324/309 |
| 4,893,103 A | * | 1/1990 | Leupold | 505/213 |
| 4,994,777 A | * | 2/1991 | Leupold et al. | 335/302 |
| 5,075,662 A | * | 12/1991 | Leupold et al. | 335/306 |
| 5,107,239 A | * | 4/1992 | Abele | 335/306 |
| 5,119,057 A | * | 6/1992 | Abele | 335/304 |
| 5,184,395 A | * | 2/1993 | Pan et al. | 29/609 |
| 5,334,966 A | * | 8/1994 | Takeshima et al. | 335/306 |
| 5,412,365 A | * | 5/1995 | Abele et al. | 335/306 |
| 5,475,355 A | * | 12/1995 | Abele et al. | 335/301 |
| 5,557,205 A | * | 9/1996 | Ohta et al. | 324/319 |
| 5,963,117 A | * | 10/1999 | Ohashi et al. | 335/306 |
| 6,680,663 B1 | * | 1/2004 | Lee et al. | 335/306 |
| 6,707,363 B1 | * | 3/2004 | Abele | 335/306 |

* cited by examiner

*Primary Examiner*—Thao X. Le
*Assistant Examiner*—Mohamad A. Musleh

(57) ABSTRACT

A magnetic structure enclosing a prismatic cavity of regular polygonal cross-section is presented. The structure contains the field within the volume of the magnet without the need of an external ferromagnetic yoke, which makes it suitable for generating fields of several Tesla. The structures presented are designed to generate uniform fields for NMR studies, especially high intensity fields.

22 Claims, 8 Drawing Sheets

$K_o = \sin \frac{\pi}{n}$

HIGH FIELD NMR PERMANENT MAGNETIC STRUCTURE

BACKGROUND OF INVENTION

The invention is directed to a permanent magnetic structure used to establish a uniform examination field in a nuclear magnetic resonance (NMR) system.

Such systems are well known as magnetic resonance imaging (MRI) instruments for medical imaging of live patients. Actually, such instruments were first developed on a small scale for laboratory use for the examination of inanimate and small animate objects and subsequently on a larger scale for application to human objects. In both applications, usually the higher the intensity of the uniform field in the region of interest, the better the resolution or other output data received from the instrument.

The design of permanent magnetic structures especially for field levels above 1 Tesla (T) faces the problems of saturation of ferromagnetic material as well as the limitations of the remanence of available magnetic alloys.

One category of permanent magnets that is not affected by these limitations is the category of yokeless magnets that are designed to generate and confine the field without the need of external yokes. Because of the linear characteristics of modern rare-earth alloys, such as Nd—B—Fe, or the oriented rare-earth alloys described in Holback, K. "Design of Permanent Multipole Magnets with Oriented Rare-Earth Cobalt Material, "Nuclear Instruments and Methods", 169, (1980):1–10 (hereinafter "Holback"), yokeless magnets are transparent to the field generated by other sources (see Abele, M. G. "Structures of Permanent Magnets", New York: John Wiley and Sons, Inc., 1993 (hereinafter "Abele"). Consequently, the field generated within the cavity of a yokeless magnet can be increased by enclosing the magnet within a second magnet and the technique can be extended to a number of concentric magnets to increase the field to levels well above the remanence of the magnetic material, as long as the individual magnets operate within the linear range of their demagnetization characteristics. Of particular importance is the generation of a uniform field within the central cavity.

SUMMARY OF INVENTION

An object of the present invention is an improved NMR system that provides higher field intensity of the NMR field in a cavity inside the structure.

Another object of the present invention is an improved NMR permanent magnetic structure capable of providing in a cavity inside the structure a uniform field intensity at a level above 1 T.

These and other objects of the invention are achieved in accordance with one aspect of the invention by the novel discovery that it is possible to configure the magnetic and physical properties of a plurality of prism-shaped permanent magnetic blocks forming an essentially yokeless permanent magnetic structure such that field intensities of a uniformity capable of supporting NMR applications and of values exceeding 1 T are obtainable. A feature of this invention is that a first set of prism-shaped permanent magnetic blocks can be provided that form an inner or first permanent magnetic enclosure for the operating cavity containing the region of interest, and that a second set of prism-shaped permanent magnetic blocks can be arranged to surround the inner set of prism-shaped permanent magnetic blocks to form a second permanent magnetic layer and even a third with the result that field intensities as high as 3–4 T may be possible. Such field intensities of a uniform field for NMR uses is extraordinary.

While the main application of the structure of the invention is for laboratory use, structures based on the principles set forth herein can be scaled up to make larger structures capable of MRI medical applications.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the present invention, like reference numerals or letters signifying the same or similar components.

DETAILED DESCRIPTION OF PREFERRED EMBODIMENTS

Figure 1:
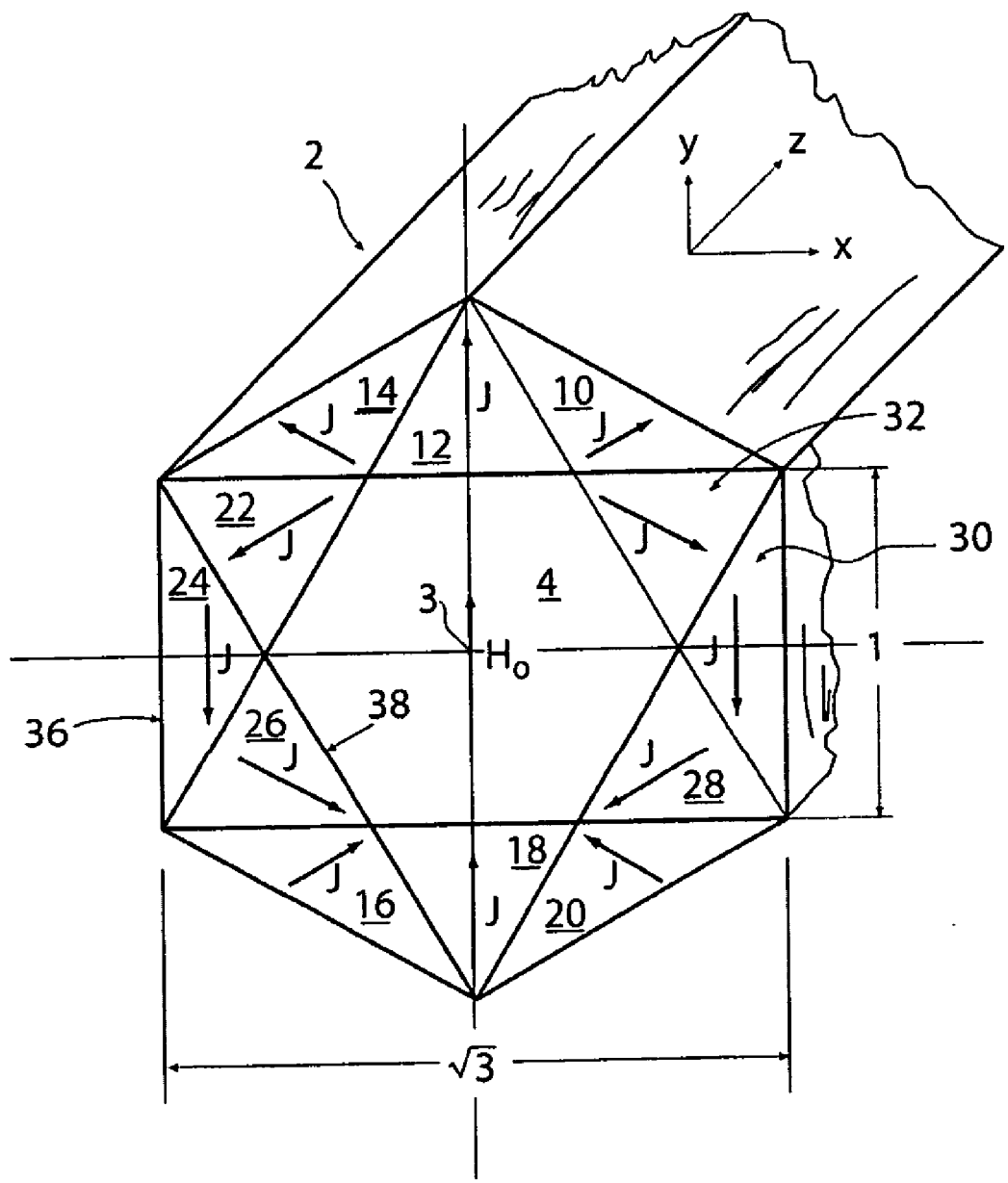
FIG. 1 is a cross-sectional view, also partly in perspective, of one form of a prismatic magnetic yokeless structure with internal and external boundaries of similar polygonal cross-sections representing a preferred embodiment in accordance with the invention.

For a better understanding of the present invention, the reader is urged to read the many technical papers which I alone or with others published and which describe various configurations of NMR imaging systems as well as various schemes for compensating for magnetic field disturbances in composite structures that have been characterized as yoked, yokeless, or hybrid magnets. Also reference is made to the referenced Abele book and Holback paper and also my papers entitled "Field Computation In Permanent Magnets", IEEE Transactions of Magnetics, 28, No. 1, Jan. 1992, Pgs. 931–934; and "Generation of Highly Uniform Field With Permanent Magnets", J. Appl. Phys., 76(10), 15 Nov. 1994, Pgs. 6247–6252. Particular attention is also directed to issued U.S. Pat. Nos. 5,494,222; 5,790,006, and 6,265,959 which describe some of the problems of fabricating magnetic structures with NMR imaging uniform fields and some solutions to those problems, the contents all of which patents and publications are herein incorporated by reference.

It will also help to present some definitions of terms used herein to avoid ambiguity. These definitions include the following.

A "high permeability" member, as used herein, shall mean a soft ferromagnetic body having a permeability, $\mu$, exceeding 10 and preferably as high as possible. For simplicity, it is sometimes referred to in the literature as a ($\mu=\infty$) material, i.e., an ideal soft ferromagnetic body. For virtually all practical purposes, the performance of infinite permeability, unsaturated ferromagnetic material is the equivalent of soft iron.

A "yoked magnetic system", as used herein, is a permanent magnetic structure surrounded by a body of high permeability material serving as a yoke to carry the full return flux of the induction B from one pole of the magnetic structure to the other pole. To avoid saturation, the yoke should have a large enough cross sectional area to convey the flux without saturating. The cross section typically various to satisfy local flux-carrying requirements.

A "hybrid magnetic system", as used herein, is a permanent magnetic structure only partially surrounded by a body of high permeability material, both the high permeability material where present and the non-surrounded parts of the structure serving to carry only part of the return flux of the induction B from one pole of the magnetic structure to the other pole. To avoid saturation, the body of high permeability material which can also be called a partial yoke should have a large enough cross sectional area to convey the flux needed without saturating. The yoke cross section typically varies to satisfy local flux-carrying requirements. Since one of the important attributes of a permanent magnetic system in accordance with the invention is that an inner layer of prism-shaped permanent magnetic blocks will be transparent to fields provided by an outer layer of prism-shaped permanent magnetic blocks, an attribute characteristic of yokeless systems, from time-to-time the term "essentially yokeless" is employed to include both the yokeless and the hybrid structures wherein the latter only includes a partial yoke which typically carries only the flux of the outer layer of prism-shaped permanent magnetic blocks.

A "uniform magnetic field", as used herein, shall mean a magnetic field that over a region of interest has an intensity that varies by less than about 100 ppm or is capable of being reduced to that value or better. It will be understood that the resultant magnetic structures described herein may not by themselves produce a field of this uniformity, but that they will maintain the perturbation of the uniform field within the cavity well within the limit of correction with standard shimming techniques.

The term "substantially" appears from time to time in the specification and claims. It should be understood in a practical sense to mean small variations in some structure or parameter term that do not make significant changes in properties associated with those structures or parameters and are included within the scope of the associated term.

The term "essentially" appears from time to time in the specification and claims. It should be understood in a practical sense to mean that it defines a structure which functionally can be characterized in a certain way but in which other aspects of the structure may be present that do not strictly conform to the sense used but also do not significantly detract from its prime or essential function. For example, a magnet may be referred to as essentially cylindrical, when in fact it may have non-cylindrical portions. But for design purposes, the magnet can still be characterized as cylindrical as the latter term signifies its main functional attributes. The same applies also with respect to the use of the term polygonal or some of the other geometrical terms used to indicate solid shapes.

Magnetic systems of this kind are often characterized using a so-called non-dimensional number identified by the symbol K, which can very between 0 and 1. Often, one starts the design with a chosen value for K depending upon the size, magnetic materials available and the field intensity desired, and this value of K remains unchanged. In the present invention, the design procedure is somewhat different in that the choice of the cavity shape, the number of polygonal sides, and the number of layers, designated by m in the present application, can be involved in the determination of K. Another non-dimensional number is the figure of merit M, which is the ratio of the energy of the magnetic field generated in the working cavity to the energy stored in the magnetized material. It will also be understood that permanent magnetic materials having the highest magnetic properties including remanence are preferred. Nowadays, these are the family of rare earth magnets such as Nd, B, Fe. Variations in the relative proportions of the main ingredients of such magnets, as is well known in the art, typically results in variations of the alloys' main magnetic properties.

When the application speaks of "configuring" the magnetic structure, this is to be understood in the context of this and the referenced literature to mean the design scheme of selecting the geometry, dimensions, materials, and/or magnetizations of the various members of the structure in the light of the design parameter K and such additional constraints as the desired active field intensity, maintenance of field uniformity, and reduction of stray fields.

Permanent magnetic structures used to implement NMR or MRI imaging are often constructed of blocks of permanent magnetic material assembled to form the configuration of the sides, top, and bottom of the structure desired and defining a cavity on its interior for receiving the object to be examined. This is typically a simpler scheme for fabricating such systems as regularly shaped blocks uniformly magnetized in a single direction are easier to fabricate by the usual powder metallurgy and grinding steps. Thus, where the specification or claims call for, for example, a polygonal-shaped magnetic structure, this should be understood to include a single member with that configuration, or several members held together by magnetic forces forming a composite member with that configuration, since, magnetically speaking, the performance is substantially the same. Moreover, though the magnetic shapes used to illustrate the invention are typically shown with smooth and/or planar surfaces, in many cases the structure configuration could be implemented with several joined magnetic members which together produce a functional equivalent. For example, the flat surface of a prismatic configuration can sometimes be more easily obtained with a composite structure made up of thin slabs of permanent magnetic material which form a slightly stepped outer surface. The composite structure, overall, would still be classified as prismatic and the resultant orientation of their magnetic fields can still be represented by a single arrow. For convenience, it may also be simpler to define the system using an arbitrary rectangular coordinate system, in which, as shown in the literature referenced, linear dimensions of the rectangular system coordinate system are measured along the X, Y or Z dimension. Also, for convenience of explanation, in the preferred embodiments which is analyzed in the rectangular coordinate system, the direction of the uniform field is chosen parallel to the Y axis, the cavity's longitudinal axis extends in the Z direction, the cavity entrance/exit for the object is at the longitudinal ends, and a cross-section perpendicular to the Z axis is in the X–Y plane. Other orientations within the scope of the invention can of course be substituted. It will also be understood that, in practical situations, normal manufacturing tolerances both in dimensions as well as in magnetic properties of the magnetic blocks introduce minor field distortions and fluctuations which are commonly compensated by a known process called "tuning" or "shimming", using shims to adjust the positions of the magnetic members, and filters for field non-uniformities. The referenced publications/patents show various shimming and compensation schemes that can be incorporated in the structures of the present invention to improve the field uniformity. Also, in the drawings, arrows are present labeled with a J or H, where J is the standard symbol for remanence, H the standard symbol for the magnitude of the uniform field, and μ the standard symbol for magnetic permeability.

The concepts underlying the development of the invention are best understood in the light of the extended development presented below, but can be briefly described as involving the following recognitions.

1. A high intensity substantially uniform magnetic field capable of implementing NMR and MRI imaging can be generated in a polygonal cavity formed within an essentially yokeless polygonal permanent magnetic structure made up of an inner layer of prism-shaped permanent magnetic blocks configured to substantially satisfy certain conditions.

2. The substantially uniform field can be further intensified by adding one or more layers of prism-shaped permanent magnetic blocks to surround the inner layer, with several of the prism-shaped permanent magnetic blocks of the outer layer being quadrangular and having prescribed dimensions.

In implementing the principles described above and below, a number of different configurations of magnetized material and soft ferromagnetic materials are possible. Preferred configurations will be described in the detailed description that follows below, but it will be understood that the invention is not limited to those particular configurations and dimensions where indicated and other different combinations of magnetic materials and of other dimensions can be employed following the principles described below to achieve the benefits of the invention, as will be understood by those skilled in this art.

First, a brief description of FIG. 1 to better understand the technical description that follows.

In FIG. 1, numeral 2 represents an elongated magnetic structure with a longitudinal axis 3 at the center. The magnetic structure 2 extends as long as may be desired in the longitudinal direction, which corresponds to the Z axis of a rectangular coordinate system having a cross-section in the X–Y plane (the plane of the drawing) wherein the longitudinal axis 3 is perpendicular to the X–Y plan. As in most so-called tunnel-type permanent magnetic closed NMR systems, the magnetic material surrounds a cavity 4 whose ends (not shown) are open for introducing and removing an object to be subjected to an NMR examination. The surrounding magnetic structure 2 is in this instance comprised of permanent magnetic material, namely, substantially uniformly-magnetized, prism-shaped blocks of permanent magnetic material. These prism-shaped blocks in the cross-section shown of the preferred embodiment of FIG. 1 comprises twelve triangular blocks arranged as follows: a first set of three blocks 10, 12, 14 at the top, a second set of three blocks 16, 18, 20 at the bottom, symmetrically disposed as two trios of blocks about the cavity 4. A third set of three blocks 22, 24, 26 at the left side, and a fourth set of three blocks 28, 30, 32 at the right side completes the enclosure of the cavity 4. Note the symmetry of the arrangement with the first and second sets symmetrically disposed as trios of blocks at top and bottom about the cavity, and the third and fourth sets symmetrically disposed as trios of blocks at the left and right sides about the cavity. As explained below, this geometry of triangular permanent magnetic blocks creates a region of interest inside the cavity 4. The region of interest means the regions inside the cavity in which can be found a magnetic field with sufficient uniformity that, with the aid of conventional techniques described in the literature and in the referenced patents above, such as shimming and compensation schemes, has a high enough level of field uniformity to allow a NMR examination of the object. As is well known in the art, the higher the level of uniformity, typically equal to or better than 100 parts per million, the higher the resolution of the object examination. Also noteworthy in this preferred embodiment is that the external geometry (boundaries) matches the internal geometry of the surfaces bounding the cavity. In this example, the external surfaces designated generally by 36 form a hexagon in cross-section, and the internal surfaces designated generally by 38 likewise form a hexagon bounding the cavity 4. The resultant magnetic structure 2 is a yokeless structure as no external yoke is needed to close the flux of the magnets when the remanence J in each of the blocks is oriented in the directions indicated by the arrows in FIG. 1. The field intensity in the cavity is indicated by the vertical arrow labeled $H_O$. The basis for or derivation of the configuration of the structure 2, meaning the blocks' shapes, sizes and magnetic orientation of their respective remanences is explained below and constitutes an important feature of the present invention.

Assume a regular polygonal cross-section of a prismatic cavity of infinite length (Z-direction), as shown in the example of a hexagonal cavity of FIG. 1, and consider the distribution of magnetization of the surrounding magnetic material that result in an external boundary of similar polygonal contour, as shown in the example of FIG. 1. The field intensity Ho in the cavity center is related to the magnitude J of the remanence of the magnetic material used by the equation:

$$\mu o\, Ho = K\, J \quad (1)$$

where μo is the magnetic permeability of a vacuum. If n is the number of sides of the similar internal and external boundaries, FIG. 1 is an example of the generally geometrical structure where the external polygon 36 is rotated by an angle π/n with respect to the internal polygon 38, and the value of parameter K in Eq. 1 that generates the similar polygonal boundaries is [Abele]:

$$Ko = \sin \pi/n \quad (2)$$

FIG. 1 illustrates a single layer magnet. The addition of a number of layers, with the same similar geometry and common interfaces of their boundaries, results in the structure partially depicted in FIG. 2 that is composed of similar quadrangles where the angle β is given by:

$$\beta = \frac{\pi}{2}\left[\frac{1}{2} - \frac{1}{n}\right], \quad (3)$$

Figure 2:
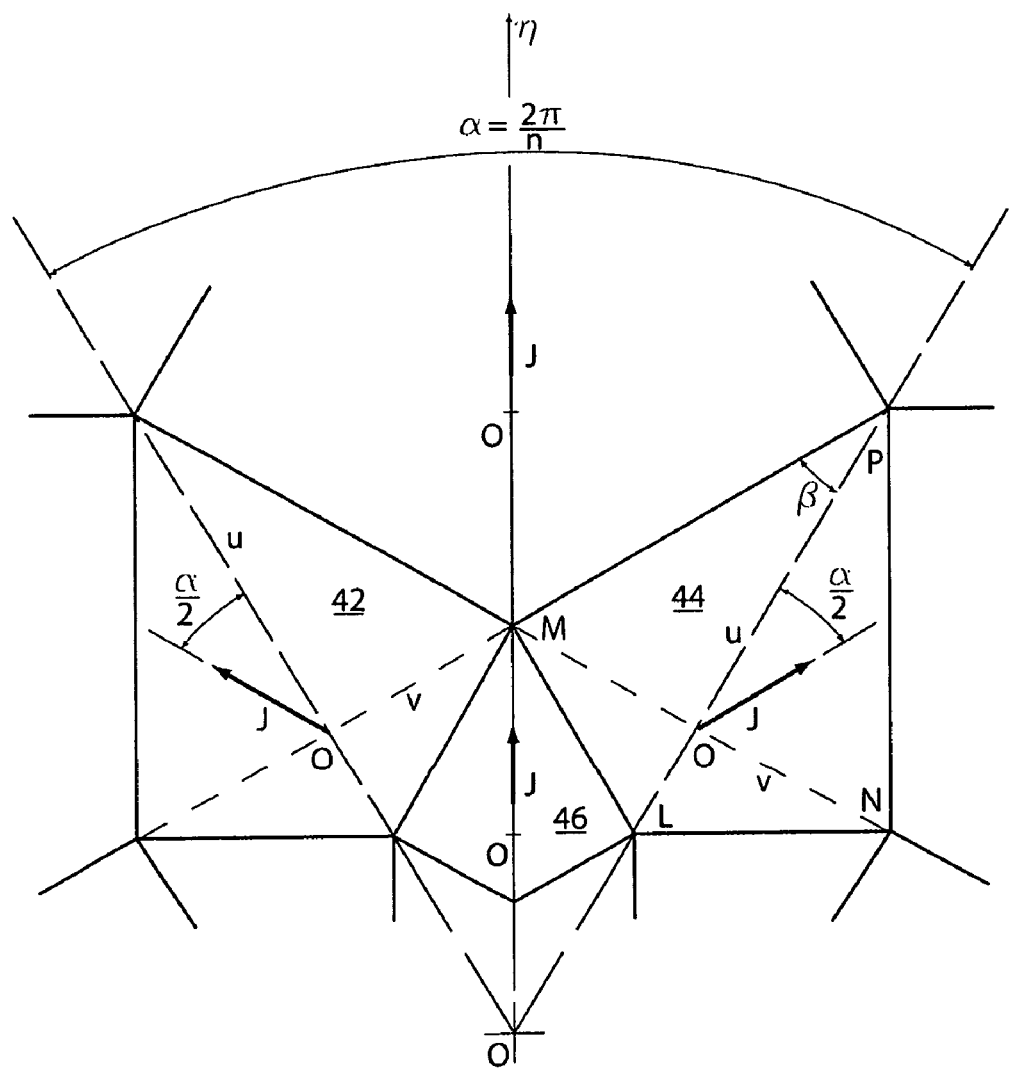
FIG. 2 is an enlarged cross-sectional view to illustrate the construction of part of a multilayer structure of magnetic material in accordance with the invention. This view explains the geometry of some of the prism-shaped permanent magnetic blocks that can be used in multi-layer embodiments.

The vertical axis η in FIG. 2 is assumed to define the orientation of the field in the central cavity of the magnet, and u and v are the diagonals of each outer quadrangle labeled 42, 44. The orientation of the remanence J of each of those quadrangles 42, 44 relative to the axis η is twice the angle of orientation of diagonal u relative to the axis η. As shown in FIG. 2, the angle α, which is the angle subtended by the diagonals $$u_i = 2\pi/n$$

In the center quadrangle 46, the remanence J is oriented in line with the axis η. In each added layer of blocks the quadrangles are arranged with the shorter diagonals v coinciding with the n sides of a regular polygonal contour. In the internal magnetic layer (not shown in FIG. 2), the quadrangles reduce to the triangles (MNP) with segment v becoming one side of the boundary of the cavity of the magnet. This can be seen in FIG. 4 for triangular components 48, 50, 52, 54. In the external layer of blocks, the quadrangles reduce to the triangles (LMN) with segment v becoming one side of the external boundary of the magnet. This can be seen in FIG. 4 for triangular components 56, 58, and 60, 62. The different hatching for the latter is explained below.

The diagonals u, v are related by $$\frac{u}{v} = \frac{1}{\sin 2\beta}, \quad (4)$$

The dimension of the quadrangles, as can be seen in FIG. 2 increases rapidly with their distance from the center of the cavity. The increase in the dimension of diagonal u from the v-th layer to the (v+1)-th layer is $$\frac{u_{v+1}}{u_v} = \frac{1}{\tan \beta}, \quad (5)$$

Table I summarizes the geometrical relations of the quadrangles for magnetic structures enclosing square, pentagonal and hexagonal cavities.

TABLE I

| n = | 4 | 5 | 6 |
|---|---|---|---|
| β = | 22.5° | 27° | 30° |
| u/v = | 1.414 | 1.236 | 1.155 |
| $(u_v + 1)/u_v$ = | 2.414 | 1.962 | 1.732 |

Figure 3A:
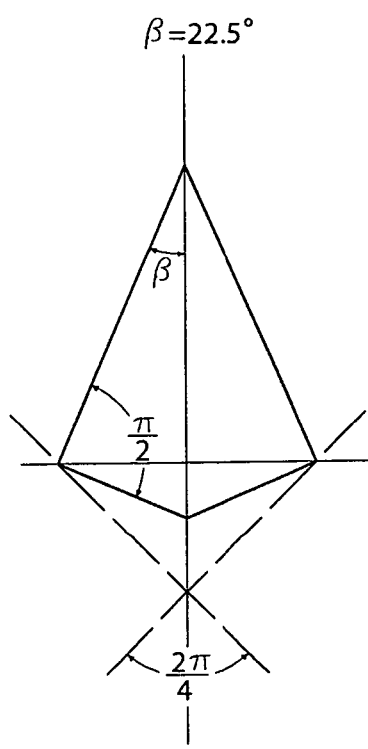
FIGS. 3A, 3B, and 3C are cross-sectional views of different quadrangular components that can be used in multilayer structures of order n=4, 5, 6, wherein n is the number of sides of the polygonal structure.
Figure 3B:
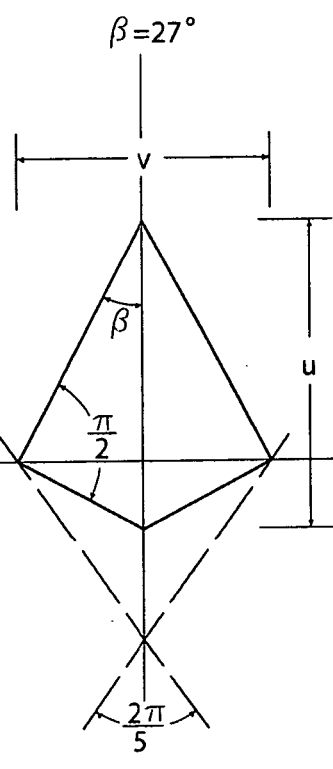
Figure 3C:
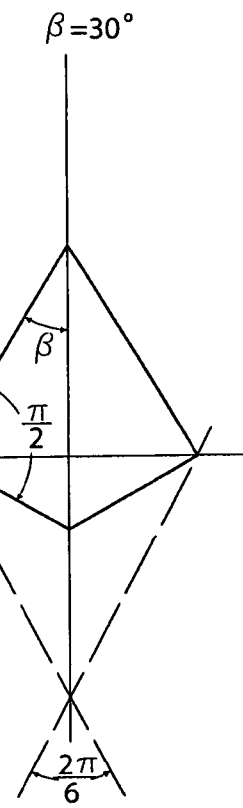

In the limit n→∞ the quadrangles reduce to square cells. The geometries of the quadrangle for n=4, 5, 6 are shown respectively in FIGS. 3A, 3B, and 3C, where the angle β is also indicated, and the relative dimensions u and v indicated in FIG. 3B. The angles β are indicated above in each of the figures. The amount of magnetized material needed for the blocks (thus the cost) increases with the number of concentric layers and one can define a figure of merit of the resultant magnet as the ratio of the energy of the magnetic field generated in the cavity to the energy stored in the magnetized material. In the prismatic structure of m magnetic layers that generate a uniform field, the figure of merit M is:

$$M = K^2 Ac/Am \quad (6)$$

where $$K = mK_0 = m\sin \pi/n \quad (7)$$

and Ac, Am are the cross-sectional areas of the cavity and the magnetized material, respectively. The figure of merit is [Abele]:

$$M = \frac{m^2 \sin^2 \frac{\pi}{n}}{\left[1 - \sin \frac{\pi}{n}\right]^{-2m} \cos^{2m} \frac{\pi}{n} - 1}, \quad (8)$$

In the limit m→∞, n→∞ Eq. 8 reduces to:

$$M = \frac{K^2}{e^{2K} - 1}, \quad (9)$$

M has a maximum $$M_{max} = 0.162 \text{ at } K = 0.797 \quad (10)$$

Eq. 9 shows that M decreases rapidly as K increases above unity. Thus the multilayer structure makes it possible to achieve increasingly larger values of the field in the magnet cavity but at the cost of an increasingly inefficient use of the magnetic material.

In the limit m→∞, n→∞, the multilayer magnet reduces to a cylindrical magnet of radius $r_e$ with a cylindrical cavity of radius $r_i$ where the parameter K is [Abele, Holback]

$$K = \zeta n \, r_e/r_i \quad (11)$$

Figure 4:
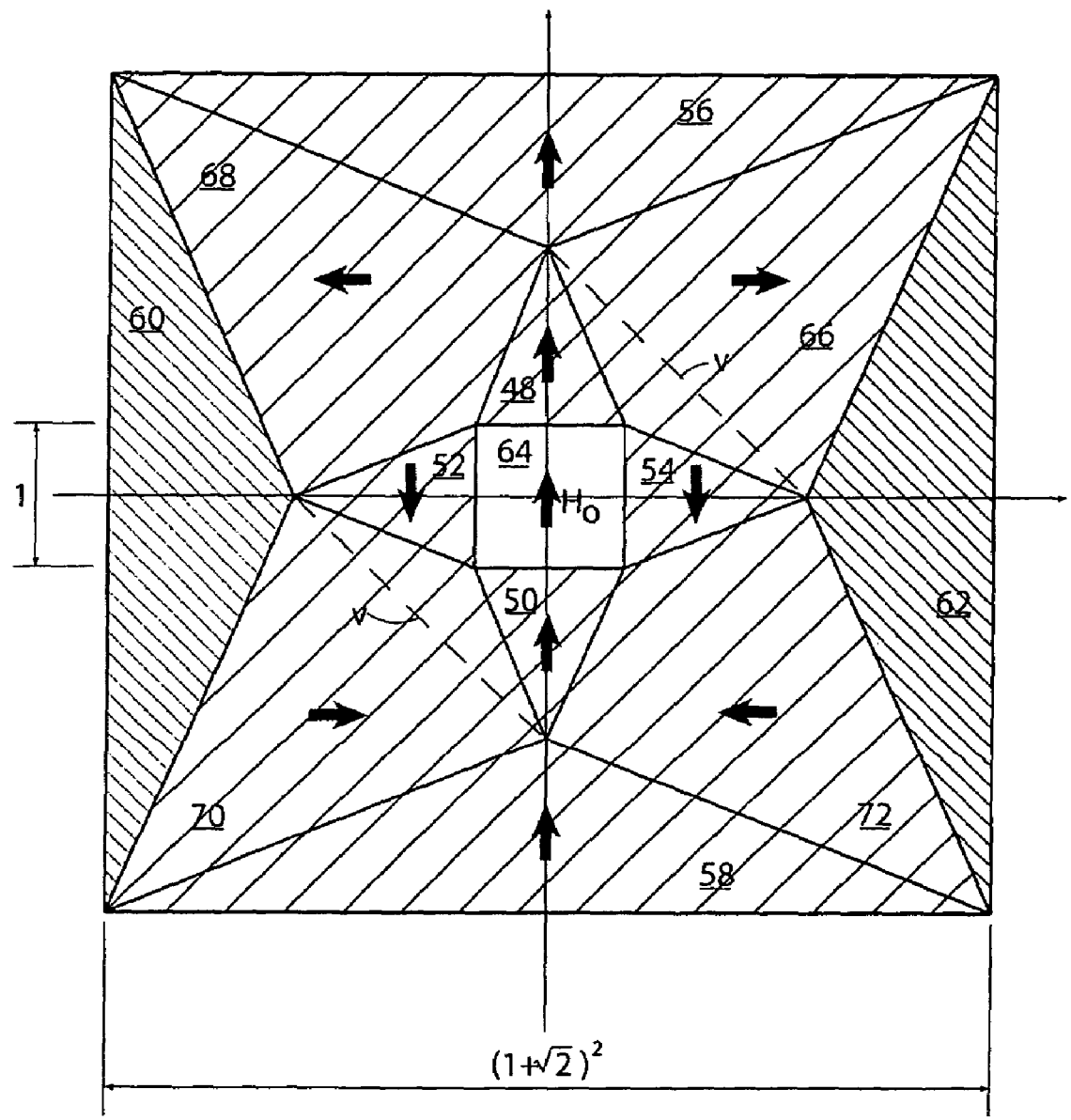
FIG. 4 is a cross-sectional view of one example of a 2 Tesla magnet with a square cross-sectional cavity comprising a 2-layer magnet.
Figure 5:
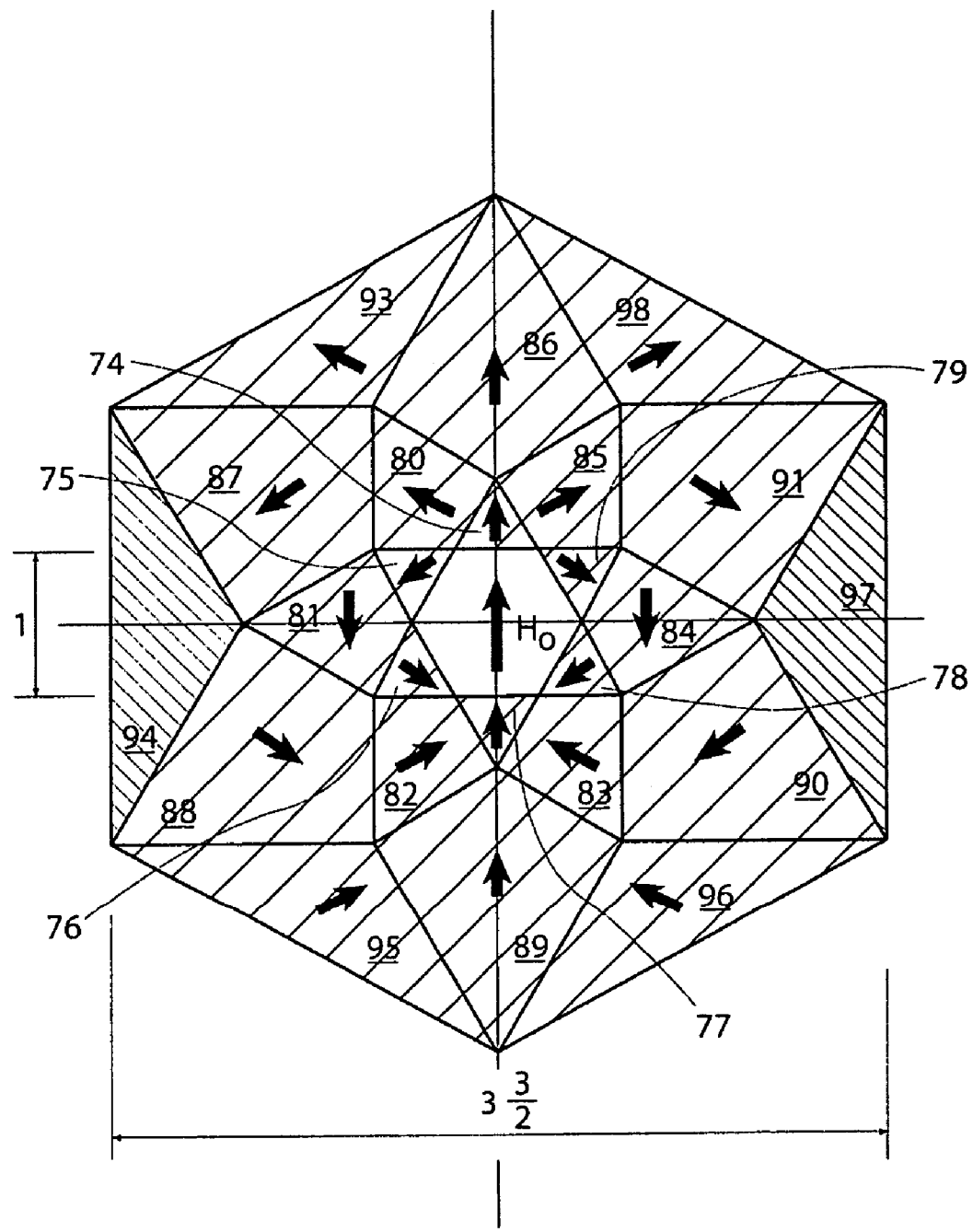
FIG. 5 is a cross-sectional view of one example of a 2 Tesla magnet with a hexagonal cavity comprising a 3-layer magnet.

Two examples of 2 Tesla magnets are shown in FIGS. 4 and 5. FIG. 4 is a two layer magnet with a square cross-section cavity 64. The value of Ko in Eq. (2) is $2^{-1/2}$. Thus with a value of J:

$$J \approx 1.4 \text{ Tesla} \quad (12)$$

The magnet of FIG. 4 generates a uniform field:

$$\mu o \, Ho = 1.98 \text{ Tesla} \quad (13)$$

The first layer of triangular magnets comprises 48, 50, 52, 54; the second layer of quadrangular magnets comprises components 66, 68, 70, 72. Two of the 4 diagonals v are shown as dashed lines in components 66, 70. The remaining four triangular components of the second layer include 56, 58, 60, 62. The external side triangles 60, 62 in FIG. 4 where the remanence in the yokeless magnet is parallel to the external boundary may be replaced by soft ferromagnetic material. This can be done even if the total field given by Eq. 13 exceeds the saturation of iron, because the external triangles 60, 62 close only the flux of the external layer of the magnet. Thus FIG. 4 is an example of a hybrid structure (also called herein as "essentially yokeless" structure) that combines the advantages of yoked and yokeless magnets, by reducing the amount of costly magnetized material required to generate the field given by Eq. (13). Note that the inner cavity square is matched by the outer boundary square.

The second example of FIG. 5 is a three layer magnet with a hexagonal cross-section cavity. The relative dimensions of a side of the inner square to that of the outer square are indicated in the drawing. The value of Ko in Eq. (2) is ½ and with the same value of J given by Eq. (12), the magnet of FIG. 5 generates a uniform field:

$$\mu o \, Ho = 2.1 \text{ Tesla} \quad (14)$$

Again the flux of the induction generated by the external layer can be closed with a partial yoke 94, 97 that replaces the external side triangular magnets where the remanence is parallel to the external boundary (see FIG. 1).

The FIG. 5 embodiment also illustrates a 2 T structure but with a hexagonal cavity matched by a hexagonal outer boundary. The inner layer of magnets comprises triangular components 74–79, a second layer of quadrangular components 80–85, and a third layer of quadrangular components 86–91 and also including 4 triangular magnetic components 93, 95, 96, 98 and 2 triangular components on the sides comprising soft ferromagnetic members 94, 97 replacing magnetic components. The result is a 2.1 T magnet, and the relative dimensions of a side of the hexagonal cavity is shown compared to the overall width of the hexagonal structure.

Figure 6:
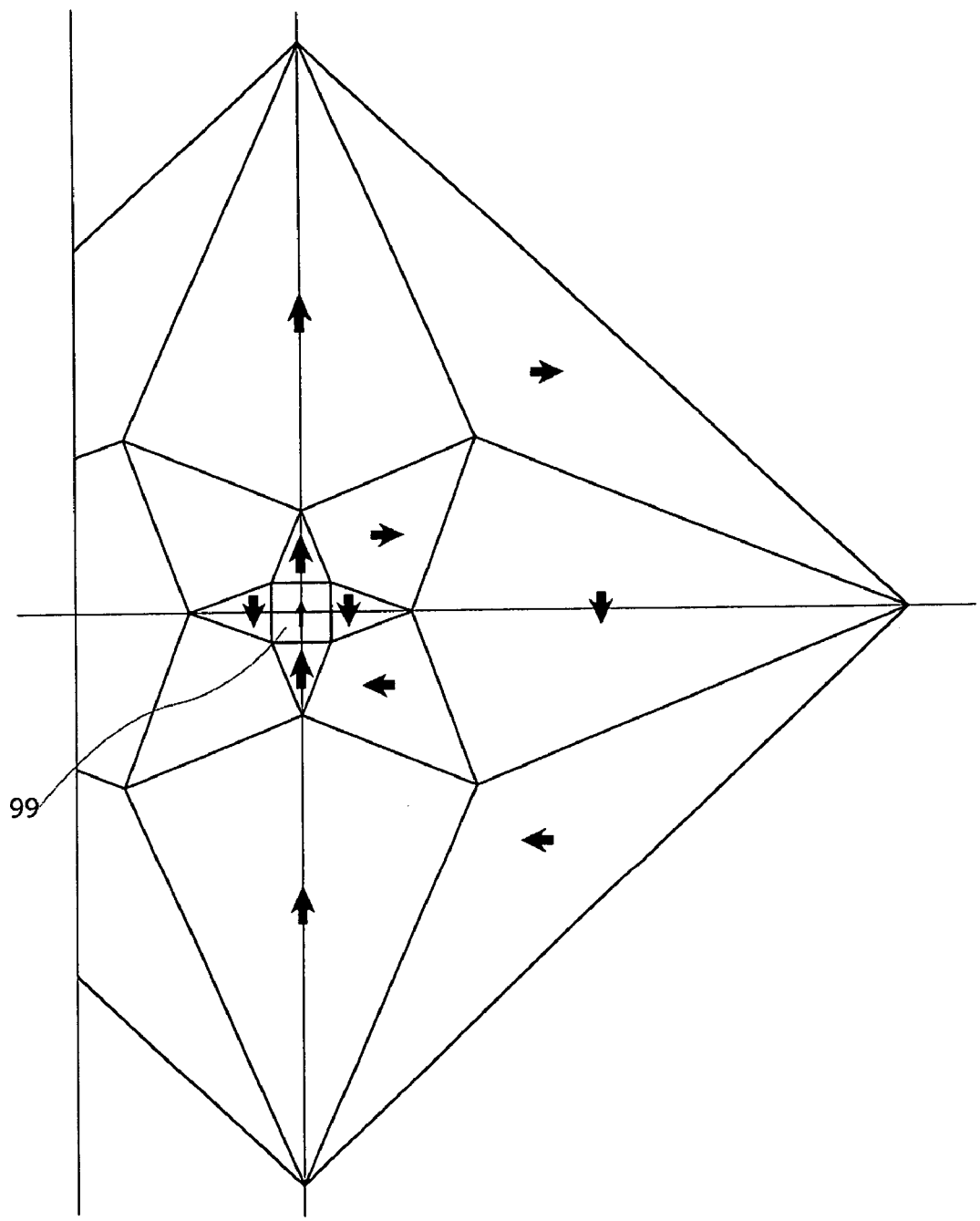
FIG. 6 is a partly cross-sectional view of one example of a 3 Tesla magnet with square cross-sectional cavity.

FIG. 6 illustrates the rapid growth of the quadrangle cells with increasing distance from the center of the magnetic structure. The partial drawing of the magnet cross-section of FIG. 6 is a 3 Tesla square magnet built around a square cross-section cavity 99. It comprises, similarly to FIG. 5, 3 layers of magnetic components. The orientation of their respective remanences is shown by the arrows. To reduce the growth of the magnet dimensions with the increasing number of layers, one may increase the number of sides of the polygonal interfaces between layers.

Figure 7:
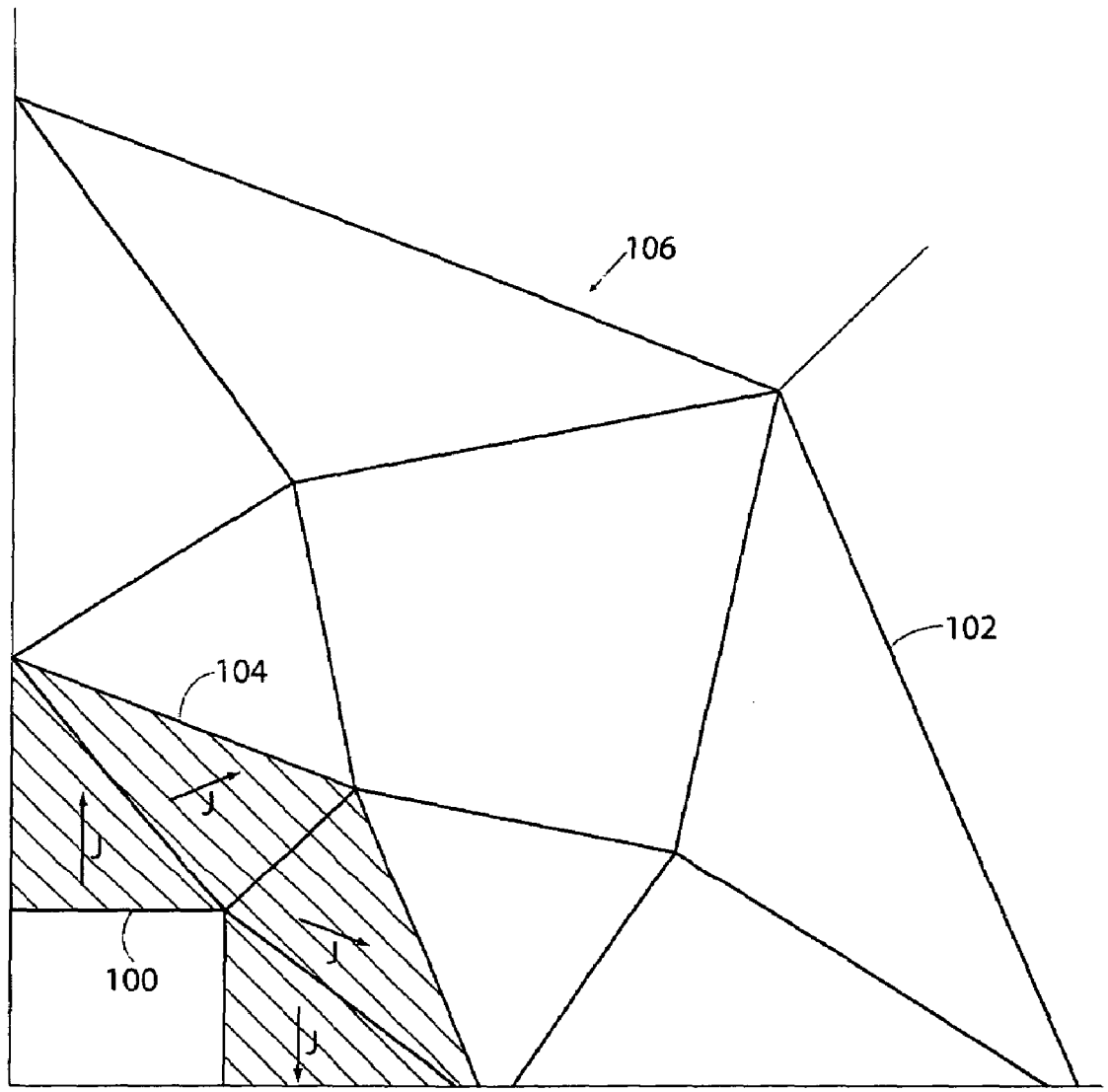
FIG. 7 is a partly cross-sectional view of one example of part of a 4 Tesla magnet with square cross-sectional cavity.

FIG. 7 illustrates the transformation from an n sided polygonal boundary to a regular 2n sided polygonal boundary, in this case an inner square 100 and an outer octagon 102, which is achieved with one layer designed to generate the value of K:

$$K = \frac{1}{2}\left(1 - \cos\frac{\pi}{2n}\right) + \sqrt{\frac{1}{4}\left(1 + \cos\frac{\pi}{2n}\right)^2 - \cos\frac{\pi}{2n}\cos\frac{\pi}{n}}, \quad (15)$$

As an example, FIG. 7 corresponds to the transformation from a square to an octagonal boundary. For n=4, Eq. (15) yields $$K=0.5596 \quad (16)$$

In FIG. 7, the transition layer comprising the hatched elements of just a single quadrant of the overall structure, is enclosed by a double octagonal layer (the unhatched components between the boundaries 104, 102 designated 106) whose individual value of K is:

$$K=\sin \pi/8=0.3827 \quad (17)$$

and the value of Eq. 4 for the individual quadrangles of the double layers (the unhatched components) is:

$$u/v=1.0824 \quad (18)$$

Figure 8:
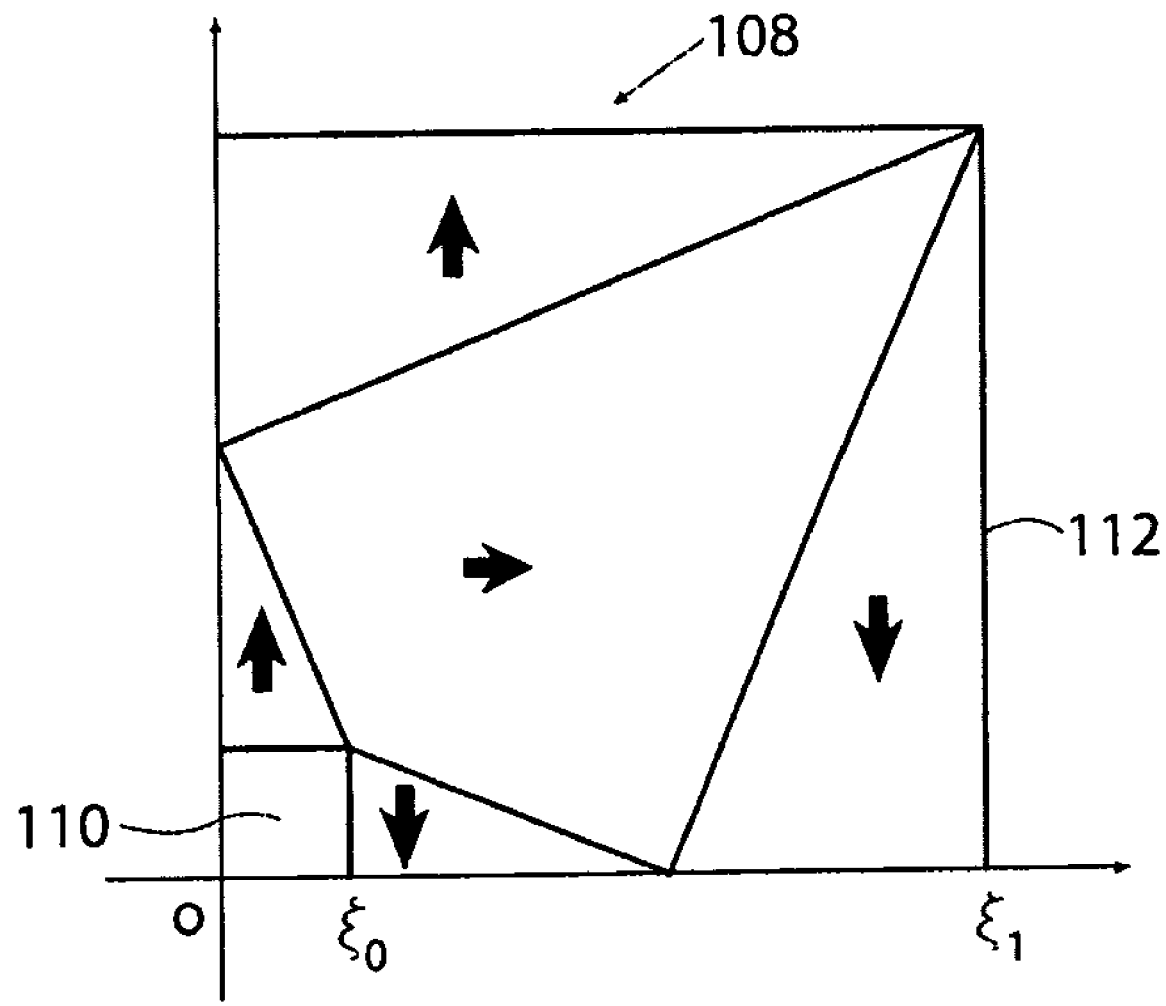
FIG. 8 is a partly cross-sectional view of one example of part of a 3 Tesla magnet with square cross-sectional cavity.

Assume now that the internal boundary 104 of the double layers in FIG. 7 encloses a double layer structure 108 (the unhatched components) with a square cross-section cavity 110 shown in FIG. 8. In FIG. 8, the corresponding "internal" boundary is designated 112. Any additional layers of magnets would then surround the square boundary 112. The total value of K then is:

$$K \approx 2.74 \quad (19)$$

and with the value (Eq. 12) of the remanence the value (Eq. 19) of K results in a magnet that generates a field:

$$\mu_0 H_0 \approx 3.84 \text{ Tesla} \quad (20)$$

the increase in complexity of the magnetic structure of increasing values of n, makes the square cross-section cavity ideal for a simpler configuration of magnetization in the components of the structure.

In these examples, each layer with the same number of sides has the same K, and with multiple layers the individual values of K are summed to produce the total value of K for the overall structure. And to achieve the novel magnetic structure of the invention, the individual K for each layer is a function of n, the number of sides of the polygonal structure of the layer.

The example of the combination of the structures of FIGS. 7 and 8 shows that a field of the order of four Tesla can be achieve in a practical permanent magnet with cavity dimensions of the order of centimeters for laboratory applications.

It is worthwhile summarizing several of the principles taught above. When the magnetic structure comprises only a single layer of components, as in FIG. 1, then all the components are triangular, meaning of course an elongated prism with a triangular cross-section. If it is desired to add a second layer, then only quadrangular components can be employed. Similarly, addition of a third layer again requires quadrangular components. However, the unusual geometry of the magnetic structure of the invention means that quadrangular components, depending upon position in the structure, can reduce to triangular components oriented in a certain manner. As explained in connection with FIGS. 2 and 4, inner quadrangular components reduce to triangular components positioned such that the pre-reduced quadrangular diagonal v (the line MN in FIG. 2) borders the cavity. See FIG. 1, components 12, 22, 26, 18, 28, 32; and in FIG. 4 components 48, 52, 50, 54. However, outer quadrangular components reduce to triangular components positioned such that the pre-reduced quadrangular diagonal v (the line MN) represents the outer boundary of the structure. See FIG. 1, components 10, 14, 24, 16, 20, 30; and in FIG. 4 components 56, 58, and 60 and 62, the latter two of which can be triangular components but also can be replaced as explained by less-costly soft ferromagnetic triangular components. In sum, the prism-shaped permanent magnetic blocks making up the structures of the invention are in principle quadrangular components but which under the limited conditions described above reduce the triangular components. For convenience, hereinafter and in the claims the expression "essentially quadrangular" has been coined to mean both quadrangular components that are actually 4-sided and triangular components that are actually 3-sided but were configured by reduction from a 4-sided quadrangular component along a diagonal. Note also that the "outer layer" is always triangular in cross-section; as in FIG. 1, FIG. 4, FIG. 5, and FIG. 6. Thus, in general, as illustrated in FIGS. 4–6, examples of multi-layer structures, the inner of first layer of permanent magnetic prism-shaped blocks are triangular in cross-section, the second layer of prism-shaped blocks are quadrangular in cross-section, but any prism-shaped blocks along the outer boundary would be triangular in cross-section reduced from quadrangular.

In the construction of the invention, it is preferred that only "regular" quadrangular components are employed. By "regular" is meant a quadrangular two sides of which are equal to each other in length, and the other two sides of which are also equal to each other in length. Under these preferred conditions, an "essentially quadrangular" components is a regular quadrangular component or a triangular component reduced or derived from a quadrangular component divided by a diagonal (the diagonal v in FIG. 2) transverse to the diagonal across the widest diameter (the diagonal u in FIG. 2) forming one of two equilateral triangular components.

The orientations of the arrows J representing the remanence in the individual blocks are accurately depicted relative to the X and Y axes (the field H in the cavity is always depicted along the Y-axis) in the various figures in the drawings by their positions shown in the drawings, and if desired the angular relationships can be measured from the drawings or can be derived from FIG. 2.

The dashed lines designated v in the components 66, 70 of FIG. 4 can represent the outer boundaries of the structure if the outer layer of quadrangular components were omitted. Together with the correspondingly positioned dashed lines (not shown) in the outer two quadrangular components 68, 72 would then result in an outer square polygon matching that of the inner cavity but rotated 45°.

The several examples presented in this paper show how practical permanent magnets designed essentially as yokeless structures can generate fields of several Tesla for high field laboratory studies. As the examples of FIGS. 4 and 5 show, the increase of the number of sides of the magnet cavity results in a more efficient use of the magnetic material, i.e., a smaller amount of magnetic material necessary to generate the same field in the same area of the cavity cross-section. However, the increase in complexity of the magnetic structure of increasing values of n makes the square cross-section cavity (as shown in FIGS. 4, 6, 7, and 8) ideal because of the similar configuration of the structure and the distribution of magnetization in the components of the structure.

As with the embodiments of the referenced papers and patents, it will be appreciated that the embodiments depict mainly a cross-section through the longitudinal axis of the structure.

Those skilled in the art will appreciate that the invention is not necessarily limited to structures with the dimensions indicated in the drawings, which are only to illustrate the size of a particular embodiment. The preferred geometry illustrated can be replaced by other geometries following the principles described herein. These other geometries are also considered within the scope of the invention.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A magnetic structure for generating a uniform magnetic field capable of implementing NMR imaging of small objects within a region of interest, the magnetic structure comprising:
   a) an elongated annular body having a longitudinal axis and comprising a plurality of substantially-uniformly-magnetized, prism-shaped blocks of permanent magnet material forming by its interior surfaces a cavity having the region of interest and sized to receive the object when introduced into the cavity along its longitudinal axis, the annular body having a cross-section in the X–Y plane of a rectangular coordinate system wherein the longitudinal axis is perpendicular to the X–Y plane and the outer boundaries of the annular body comprising the prism-shaped blocks of permanent magnet material form a regular polygon, the cavity being closed on the top, bottom and sides except for the ends for introducing and removing the object,
   b) the prism-shaped blocks including when viewed in the X–Y plane at least a first layer of blocks whose inner surfaces form the boundary of a regular polygonal cavity, the first layer of blocks comprising at least first, second, third, and fourth blocks and being symmetrically disposed with respect to the longitudinal axis,
   c) the intensity of the magnetic field Ho generated in the cavity by the structure being oriented along the Y-axis.
   d) the respective dimensions and the orientations of the remanences J of the first layer of blocks being such that the induction B generated by the permanent magnetic components of the structure is confined substantially inside the structure, thereby forming an essentially yokeless magnetic structure requiring no complete external yoke to form the return path for the flux generated by the prism-shaped blocks,
   e) the orientation of the magnetic field in the region of interest being perpendicular to an inner surface of at least one of the blocks of the first layer,
   f) the magnetic configuration of the overall structure being such that the magnetic field Ho generated in the cavity has sufficient uniformity to support an NMR examination of the object when inside the region of interest,
   g) the magnetic structure having a design parameter K characteristic of a structure that will generate an inner regular polygonal cavity and an outer regular polygonal boundary,
   h) the magnetic structure comprising at least a first layer of prism-shaped blocks adjacent the cavity and a further layer of prism-shaped blocks surrounding the first layer, the first layer of prism-shaped blocks having a triangular cross-section in the X–Y plane, the further layer of prism-shaped blocks having an essentially quadrangular cross-section in the X–Y plane.

2. The magnetic structure as claimed in claim 1, wherein the parameter K has a value that is a trigonometric function of $\pi/n$, where n is the number of sides of the polygonal cavity or the outer polygonal boundary.

3. The magnetic structure as claimed in claim 2, wherein the parameter K has a value that is a function of the sine or the cosine of $\pi/n$.

4. The magnetic structure as claimed in claim 2, wherein the polygonal cavity and the outer polygonal boundary have the same number of sides n.

5. The magnetic structure as claimed in claim 2, wherein the number of sides n is in the range of 4–8.

6. The magnetic structure as claimed in claim 1, wherein some of the blocks of the further layer being 4-sided, and some being 3-sided reduced from 4-sided blocks.

7. The magnetic structure as claimed in claim 6, wherein some of the 3-sided blocks of the further layer whose remanence originally was parallel to an outer surface are replaced by a soft ferromagnetic member having a triangular cross-section in the X–Y plane.

8. The magnetic structure as claimed in claim 1, wherein the quadrangular prism-shaped blocks each have a long and a short diagonal, the long diagonal together with one of the quadrangle sides subtending an angle $\beta$, the smallest interior angle of each quadrangular prism-shaped block subtending an angle $2\beta$ where $\beta$ is a function of the number of sides n.

9. The magnetic structure as claimed in claim 8, wherein the long and short diagonals of each of the quadrangular prism-shaped blocks are a function of $\beta$.

10. The magnetic structure as claimed in claim 9, wherein n is the number of sides of the polygonal cavity or of the outer polygonal boundary, the dimensions of the prism-shaped blocks having an essentially quadrangular cross-section in the X–Y plane that increase rapidly with their distance from the center of the cavity.

11. The magnetic structure as claimed in claim 4, wherein the structure forms an inner hexagonal cavity and an outer hexagonal boundary and comprises twelve prism-shaped blocks each having a triangular cross-section in the X–Y plane.

12. The magnetic structure as claimed in claim 4, wherein the magnetic structure has a square cavity and a square outer boundary and comprises at least an inner layer of prism-shaped blocks comprising four prism-shaped blocks having a triangular cross-section in the X–Y plane and symmetrically disposed around and adjacent the cavity with respect to the longitudinal axis and each having a remanence J oriented parallel to the orientation of the field in the cavity, and four regular quadrangular blocks symmetrically surrounding the four triangular blocks and positioned with the quadrangular blocks' apices subtending the smallest angle pointing away from the cavity.

13. The magnetic structure as claimed in claim 12, wherein the structure further comprises four triangular prism-shaped blocks each adjacent the sides of two of the quadrangular blocks, two of the latter four triangular blocks being magnetic and two being soft ferromagnetic.

14. The magnetic structure as claimed in claim 4, wherein the magnetic structure comprises a hexagonal cavity and an outer hexagonal boundary and comprises at least an inner layer of prism-shaped blocks and concentric therewith two further layers of prism-shaped blocks, the inner layer of prism-shaped blocks having a triangular cross-section in the X–Y plane, the further layers of prism-shaped blocks having an essentially quadrangular cross-section in the X–Y plane.

15. The magnetic structure as claimed in claim 4, wherein the magnetic structure comprises a square cavity and an outer octagonal boundary and comprises at least an inner layer of prism-shaped blocks and concentric therewith two further layers of prism-shaped blocks, the inner layer of prism-shaped blocks having a triangular cross-section in the X–Y plane, the further layers of prism-shaped blocks having an essentially quadrangular cross-section in the X–Y plane.

16. The magnetic structure as claimed in claim 4, wherein the magnetic structure is configured to provide inside the cavity a magnetic field having an intensity of at least 1 Tesla.

17. The magnetic structure as claimed in claim 4, wherein the magnetic structure is a multi-layer structure comprising essentially quadrangular prism-shaped blocks configured to provide inside the cavity a magnetic field having an intensity equal to or greater than about 1 Tesla.

18. The magnetic structure as claimed in claim 11, wherein the external hexagon is rotated by an angle of $\pi/n$ with respect to the inner polygon, where n=the number of sides of the hexagon.

19. The magnetic structure as claimed in claim 18, wherein the cavity height in the cavity field direction and the external hexagon has sides whose relative length is equal to 1 and the magnetic structure has a width whose relative width dimension in the X–Y plane and perpendicular to the cavity field direction is equal to $3^{1/2}$.

20. The magnetic structure as claimed in claim 4, wherein the prism-shaped permanent magnetic blocks are constituted of rare earth alloys magnetized to operate within a linear range of their demagnetization characteristics.

21. The magnetic structure as claimed in claim 4, wherein the cavity height in the cavity field direction has a relative length equal to 1 and the magnetic structure has a width whose relative width dimension in the X–Y plane and perpendicular to the cavity field direction is equal to $(1+2^{1/2})^2$.

22. The magnetic structure for generating a uniform magnetic field capable of implementing NMR imaging of small objects within a region of interest, the magnetic structure comprising:
   a) an elongated annular body having a longitudinal axis and comprising a plurality of substantially-uniformly-magnetized, prism-shaped blocks of permanent magnet material forming by its interior surfaces a cavity having the region of interest and sized to receive the object when introduced into the cavity along its longitudinal axis, the annular body having a cross-section in the X–Y plane of a rectangular coordinate system wherein the longitudinal axis is perpendicular to the X–Y plane and the outer boundaries of the annular body comprising the prism-shaped blocks of permanent magnet material form a regular polygon, the cavity being closed except for the ends for introducing and removing the object,
   b) the prism-shaped blocks including when viewed in the X–Y plane first (12), second (10) and third (14) blocks at the structure top and fourth (18), fifth (16) and sixth (20) blocks at the structure bottom symmetrically disposed as a trio of blocks about the cavity,
   c) the prism-shaped blocks further including and seventh (24), eighth (22), and ninth (26) blocks at one structure side and tenth (30), eleventh (28), and twelfth (32), blocks at the other structure side between the two trios of blocks and also symmetrically disposed as trios of blocks about the cavity.
   d) each of the prism-shaped blocks having a remanence J, the remanence J in each of the first, fourth, seventh, and tenth prism-shaped blocks being each oriented in a direction parallel to the field direction,
   e) the interior surfaces of the prism-shaped blocks of permanent magnet material and the outer boundaries of the annular body forming a hexagonal configuration,
   f) the dimensions and the orientations of the remanence J of the prism-shaped blocks being such that the induction B generated by the permanent magnetic structure is confined substantially inside the structure, thereby forming essentially a yokeless magnetic structure requiring no external yoke to form the return path for the flux generated by the first through the twelfth prism-shaped blocks,
   g) the magnetic field in the region of interest being oriented along the Y-axis.

\* \* \* \* \*